United States Patent [19]
Welham et al.

[11] Patent Number: 5,084,876
[45] Date of Patent: Jan. 28, 1992

[54] METHOD AND APPARATUS FOR TESTING DIGITAL CIRCUITS

[75] Inventors: Robert K. Welham, Bristol, England; Ajay Gupta, Bangalore, India

[73] Assignee: Hewlett-Packard Company, Palo Alto, Calif.

[21] Appl. No.: 457,697
[22] PCT Filed: Mar. 3, 1989
[86] PCT No.: PCT/GB89/00209
§ 371 Date: Dec. 29, 1989
§ 102(e) Date: Dec. 29, 1989
[87] PCT Pub. No.: WO89/08297
PCT Pub. Date: Sep. 8, 1989

[30] Foreign Application Priority Data
Mar. 3, 1988 [GB] United Kingdom ............... 8805120

[51] Int. Cl.$^5$ ............................................. G06F 11/00
[52] U.S. Cl. ........................................ 371/23; 371/27; 364/578
[58] Field of Search ............... 371/15.1, 23, 27, 22.1; 364/578, 489, 490, 200, 900

[56] References Cited

U.S. PATENT DOCUMENTS

| | | | |
|---|---|---|---|
| 4,228,537 | 10/1980 | Henckels | 371/23 |
| 4,868,825 | 9/1989 | Koeppe | 371/23 |
| 4,961,156 | 10/1990 | Takasaki | 364/578 |

OTHER PUBLICATIONS

R. Lbath, "A Test Pattern Generation Environment for Complex Digital Circuits", ECE Session A, 4/1986, pp. 66–72.

S. Funatsu, "An Automatic Test-Generation System for Large Digital Circuits", 10/1985, pp. 54–60.
R. Hickling, "Automating Test Generation Closes the Design Loop", 11/1981, pp. 129–133.
M. Genesereth, "Diagnosis Using Hierarchical Design Models", 1985, pp. 278–283.

*Primary Examiner*—Robert W. Beausoliel
*Attorney, Agent, or Firm*—Woodcock Washburn Kurtz Mackiewicz & Norris

[57] ABSTRACT

Means are provided which aid in generating programs for testing digital modules. Formal hierarchical descriptions (e.g. in Prolog) of the module without and with a defined fault are stored in a storage device comprising two stores backed up by a submodule store. The two moldule descriptions are fed into registers. Then, repeatedly, (a) an unfolding processor works down the hierarchy, (b) a simplification processor simplifies the descriptions using a variety of logical and arithmetical rules, and (c) a discrimination condition extraction processor extracts discrimination conditions which are common to both module descriptions and necessary (i.e. must be satisfied as part of the final test programme). Another processor has discrimination condition storage means and discrimination condition consistency checking means coupled to it. The processors use common rules, stored in a logical rules store, which rely heavily on expressions of the if-then-else form. The simplification processor may allow operator intervention so that the operator may guide and/or perform certain simplifications and/or their order. Thus a sequence of discrimination conditions is found, acting to gradually focus down onto the point where the two modules—sound and faulty—differ.

14 Claims, 2 Drawing Sheets

METHOD AND APPARATUS FOR TESTING DIGITAL CIRCUITS

The present invention relates to the testing of digital electronic assemblies.

Such assemblies exist at a large variety of complexities, from circuits consisting of discrete resistors and transistors, through circuit boards carrying a large number of VLSI integrated circuits, up to complete computer systems. It is frequently desirable or necessary to be able to test such assemblies.

At the lowest levels, testing individual components such as resistors and transistors often requires checking of parameter values; in this case, the components themselves are not being treated as digital devices. At the highest levels, testing is performed by the assemblies themselves running self-test programs. In between these two extremes, testing involves applying specially selected combinations of inputs to the assembly and monitoring the outputs. It is with this intermediate level that the present invention is primarily concerned.

The testing of such assemblies will often be at a sequence of different levels; if an assembly is found to be faulty, it may be broken down into subassemblies which are then tested individually. This breaking down may be achieved by physical disassembly or by the use of probes (e.g. bed-of-nails testers) reaching individual subassemblies in the complete assembly. In the latter case, the subassemblies are in principle being tested individually, although their responses will be complicated by the responses of those other subassemblies to which they are connected.

The present invention is particularly concerned with testing of assemblies which are treated as units—i.e. testing which involves only applying inputs to and monitoring outputs from the entire assembly without direct access to internal points or components of the assembly.

A further problem involved with testing is that of intermittent faults. These are notoriously hard to identify. The present invention is not concerned with such faults.

Given an assembly which requires testing, a test program—a combination of test inputs, or a sequence of such combinations—must be designed for it. With sufficiently simple assemblies, there is no problem in designing a test sequence; the testing can be exhaustive. A 2-input AND gate, for example, can be tested by applying all four possible combinations of inputs to it and monitoring the output (or both outputs, if it also has a complementary output). For more complicated assemblies, however, exhaustive testing is not possible, because the number of possible combinations of input bits rises exponentially with the number of inputs and because the number of possible internal states of the assembly also has to be taken into account if it goes beyond pure combinatorial logic to include any form of flip-flops or other storage.

It is possible to choose a random or pseudorandom sequence of test programs for use with such an assembly, on the assumption that a reasonably long such sequence will almost certainly detect any faults. Alternatively, it is possible to decide beforehand what faults are likely, and to attempt to design a test program which will detect such faults. This latter approach has hitherto involved treating the problem of designing the test programs as an intellectual puzzle.

The object of the present invention is to provide an automatic method and apparatus for generating, or assisting in the generation of, test programs for digital electronic assemblies for detecting predetermined faults.

A method and apparatus is provided for storing formal hierarchical descriptions to define an assembly without and an assembly with a fault. A representation is also stored of at least a part of the assembly derived from its formal description for the assembly without the fault and for the assembly with the fault. The stored representation is hierarchically expanded and simplified and discrimination conditions are extracted from the stored representation.

In accordance with this invention, the apparatus comprises means for storing the formal hierarchical descriptions sufficient to define the assembly without and with the fault and register means for holding, for each assembly without and with the fault, a representation of at least a part of the assembly derived from its formal description. An unfolding processor means hierarchically expands the contents of the register means. A simplification processor means applies simplification rules to the contents of the register means, and discrimination condition extraction processor means extracts discrimination conditions from the contents of the register means.

Preferably the means for storing the formal hierarchical description of the two assemblies comprise primary storage means, for storing the respective descriptions of the two assemblies, consisting of first storage means for storing a complete description of one of the assemblies and second storage means for storing a description of the fault, and a submodule storage means coupled thereto for storing descriptions of submodules which may be repeated in the assemblies and/or common to both.

Preferably also the discrimination condition extraction processor has coupled to it discrimination condition storage means for accumulating successive discrimination conditions determined by that processor.

The simplification rules stored by the processor may consist of logical rules, arithmetical rules, and rules relating to specific circuit properties of the two assemblies. Optionally, this processor may allow operator intervention so that simplification, particularly relating to arithmetical expressions and specific circuit properties of the two assemblies, may be performed by the operator.

INTRODUCTORY SUMMARY

Figure 1:
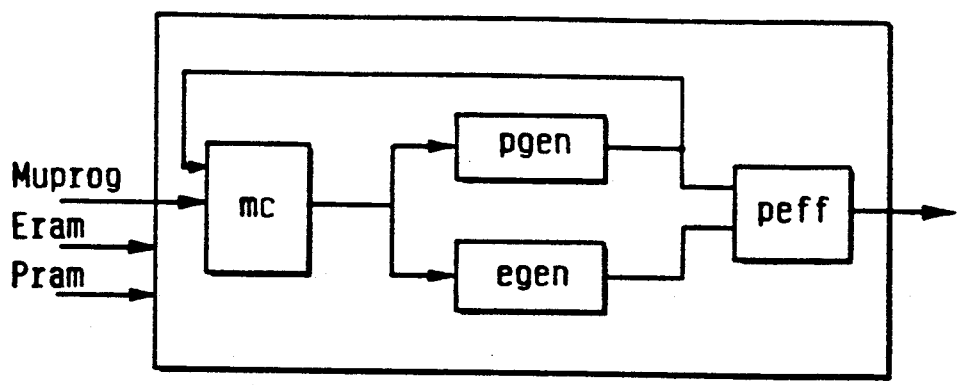
FIG. 1 is a block diagram of a typical digital electronic assembly for which test programs are to be designed.

The present invention is concerned with the testing of digital circuit assemblies, and more specifically with the design or generation of test programs therefor. For this, the assembly must be described in a formal description language, which defines the behaviour of the assembly to a sufficient degree of detail. Also, the nature of the fault to be tested for must be similarly defined.

More precisely, the faulty assembly is described in the same way as the sound assembly. Thus there are in effect two assemblies, the sound one and the faulty one. The descriptions of these two assemblies are expanded, analysed, and compared, using a three-stage cycle of unfolding, simplification, and extraction of discrimination (or distinguishability) conditions.

The description of each assembly is in tree (hierarchical) form, consisting of a series of functional statements each of which can be expanded or unfolded by going down the tree. The initial statement or statements describing the assembly—the top-level module—contain explicit references to the constituent modules at the next level down the hierarchy. These references implicitly refer to the functions of these modules, and the unfolding involves the copying of the functions of these modules into the initial statement or statements, so that the functions of these modules are explicitly given in the resulting versions or transformations of the initial statements.

The simplification stage involves applying a variety of logical and arithmetical rules to manipulating the resulting statements to bring them into more convenient form. The simplifications are directed, as far as possible, towards making possible the next stage—the extraction of discrimination conditions. For this, the two parallel sets of statements for the sound and faulty assemblies are compared for conditions which match in the two sets. Such conditions are common, in the sense that they are the same for both sets, and necessary, in the sense that they must be satisfied as part of whatever combination of test inputs is eventually generated. Thus they are removed from the two sets of conditions and recorded. The resulting two sets of reduced conditions are then put through the three-stage cycle again. Eventually, the two sets of reduced conditions simply define the same condition, and this is the final discrimination condition.

Thus a sequence of discrimination conditions is found. As these accumulate, they act, in effect, to gradually focus down onto the point where the two assemblies—the sound and the faulty—differ. It is then straightforward to generate an actual test program from these. (The present invention is not concerned with this latter step, which is therefore not described.)

The simplification and discrimination condition extraction processes rely heavily on expressions of the if-then-else form.

PROLOG

The present specification assumes a basic knowledge of logic programming such as that possessed by any skilled worker in the field. In particular, some knowledge of the logic programming language Prolog is assumed (for a basic text, refer to "Programming in Prolog", W F Clocksin and C S Mellish, Springer-Verlag, 1984). As an aid in understanding the invention, however, an exceedingly brief summary of Prolog is as follows. This summary is of course far from precise; for accuracy, reference must be had to a standard text on Prolog, such as the Clocksin and Mellish book.

Prolog is a declarative language designed primarily for symbolic, non-numeric computation, and a Prolog program consists of a set of fact and rule statements. There is almost nothing corresponding to the program structure of, say, Fortran.

For present purposes, the ultimate elements of Prolog are constants. Variables also, of course, exist in Prolog, though they are "ultimately" (in the sense just used) instantiated as ("replaced by") constants. A constant is normally written with an initial lower-case letter (e.g. john), a variable with an initial upper-case letter (e.g. X or Father).

A typical simple Prolog fact statement has the form parent (john,susan), which can be taken as meaning that john is the parent of susan. A query or goal has the same form as a fact statement preceded by a query symbol ?. Thus ?parent (john,Child) is a query. A Prolog system will recognize a query, identify the variables in it (in this case Child, identified as a variable by its initial upper-case letter), and try to find a "solution" to the implied goal of finding a constant which makes the query statement true. (In this case, the variable Child is instantiated to the constant susan.) A fact statement can have any number of arguments, and any of these can be variables; if the fact statement is a query, the system tries to find constants for all these variables. (A goal or query can consist of a combination of statements, so that for example a variable has to satisfy two or more query statements together.)

More general relationships are expressed as rules, which are composed of statements having the same general form as fact statements. An example of a relationship is

```
grandfather(X,Y) :-
    father(X,Z),
    father(Z,Y);
    father(X,Z),
    mother(Z,Y).
```

(Here the comma indicates logical AND, so that for example father (X,Z) and father (Z,Y) must both be true, while the semicolon indicates logical OR, so that grandfatherhood can be paternal or maternal.) The system is able to utilize the rules to draw logical conclusions in trying to satisfy a goal or query; in other words, if it finds that the left-hand portion of a rule might satisfy a query, it is able to set up the right-hand side as one or more sub-queries.

A fundamental feature of Prolog is that rules can be recursive. A simple example is

```
ancestor(X,Y) :-
    parent(X,Y).
ancestor(X,Z) :-
    parent(X,Y),
    ancestor(Y,Z).
```

The second rule defines the ancestorhood relationship recursively. A recursive relationship like this must always be accompanied by an alternative non-recursive rule for the same relationship; here, the first rule defines the required alternative ancestorhood relationship. (There are also further limitations which must be observed if the danger of infinite regress is to be avoided.)

Prolog is primarily a declarative rather than a procedural language. The primary way to achieve something in Prolog is therefore by formulating a goal—a statement preceded by a query symbol. The system attempts to satisfy this goal, by looking for constants which can be substituted for the variables in the goal. In so doing, the system searches through the various statements, looking for ones which match the goal or some part of it. This may involve replacing a variable in the goal by a statement in the system, which then becomes a subgoal. So statements can often be regarded as declarative formulations of what, in procedural systems, would be subroutines. (The ancestor rules above are a simple example of this.) The setting up of a subgoal in a Prolog system is broadly similar to the calling of a subroutine in a procedural system.

Although Prolog is primarily symbolic, it is possible to include numeric functions in it. In fact, some basic functions like addition of integers are normally built into the system, and more complicated functions can be defined in terms of these basic functions.

In the description which follows, the conventions of Prolog will be used, though somewhat loosely and informally. Further, some aspects of the invention will be described procedurally rather than declaratively. It will be realized that on the one hand, the invention can be implemented largely by means of declarative statements supported by a conventional Prolog or Prolog-like system; on the other hand, the invention can be implemented largely procedurally.

FORMAL DESCRIPTION OF HARDWARE

The present invention is concerned with generating, automatically or semi-automatically, a test program—a set of test conditions—for testing the operation of a defined piece of hardware. For this, the hardware to be tested has to be described in a predetermined formal manner—that is, using a formal language, which is in the preferred embodiment a Prolog-like language. The nature of this language will become apparent from an example.

An Example of a Hardware Circuit

FIG. 1 is a block diagram of a circuit for monitoring the behaviour of a memory. (This circuit is in fact a simplified version of a practical circuit, in which there is a bank of 24 edge pulse generators operated in parallel.) A microprocessor mc controls a loop pulse generator pgen, the output of which is fed to peff and fed back to the microprocessor, and an edge pulse generator egen the output of which is fed to a pulse edge flip-flop peff; the output of this flip-flop is observable. The loop pulse generator and edge pulse generator are of similar construction.

The operation of the circuit is that the microprocessor initially programs the two generators with various delay times. It then sends a sequence of signals to the two generators, each signal selecting the next delay of the stored sequence of delays. The loop pulse generator pgen sends its output back to the microprocessor at the end of each of its delays (cycles), and the microprocessor then sends out the next signal to the two generators. The edge generator egen responds similarly to the signals from the microprocessor, producing a signal after each of its preset delay times. These signals are sent to the pulse edge flip-flop to set it. The delay of the edge generator egen may exceed that of the pulse generator pgen, so the edge generator egen must be able to measure two delays at the same time, one starting with the most recent select signal from the microprocessor and the other still running from the previous such signal. It therefore contains two delay circuits, unlike the loop pulse generator. The microprocessor inspects the state of the pulse edge flip-flop on receiving the pulse from the loop pulse generator; this pulse also resets the pulse edge flip-flop if it was set during the cycle ended by this pulse.

Figure 2:
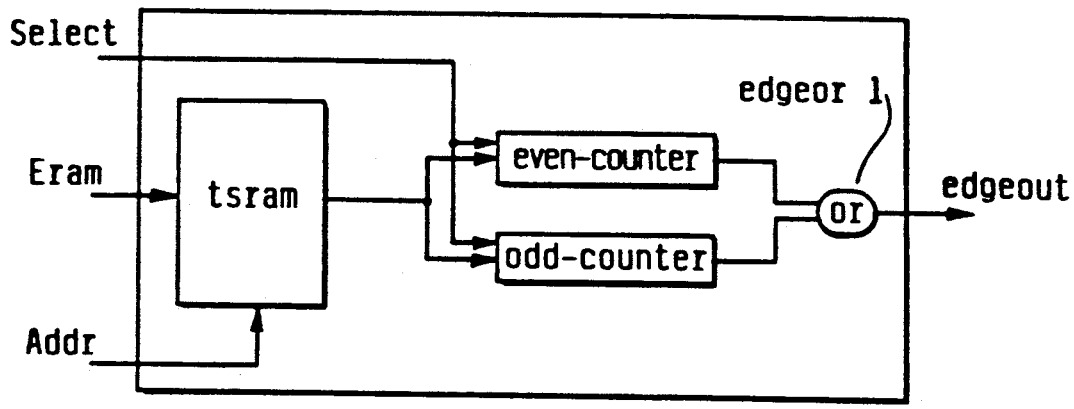
FIG. 2 is a block diagram of a component module of this assembly.

FIG. 2 is a block diagram of the edge generator unit egen. This consists of a test signal random access memory tsram, two counters even_counter and odd_counter, and an OR gate or (also named edgeor1) as shown. The RAM initially has a series of delays stored in it, as a series of values of a signal addr_bus on a 16-bit bus (the RAM size is 256×16 bits). The microprocessor then sends a sequence of addresses; as each address is received, the corresponding stored value is read out of the RAM and passed to the even and odd counters over a bus data_bus. A select signal select generated by the microprocessor changes state on each "cycle", so that the even and odd counters are alternately selected. The selected counter has the stored value from the RAM set into it, and then counts down steadily in response to clock pulses; when the count reaches 0, the counter produces an output pulse. This output pulse is passed through the OR gate to produce a signal edgeout, which is fed to the pulse edge flip-flop peff.

Formal Description of this Circuit

The formal description of this circuit will be developed by means of Prolog-like statements, treating the circuit as a hierarchy of modules. (It will be realized, of course, that other formal types of description exist, and can be used instead of the present Prolog-type form.)

Figure 3:
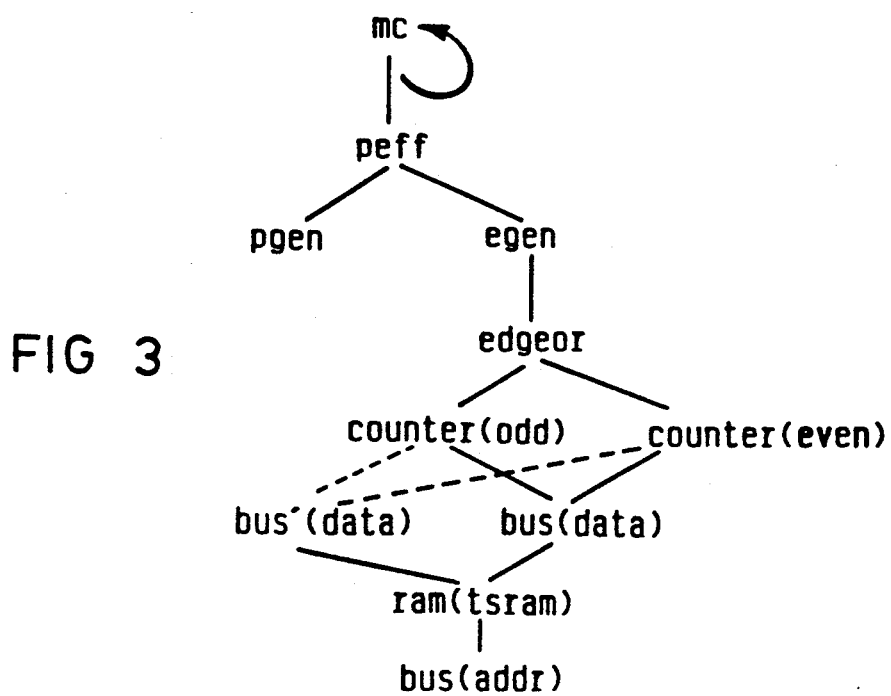
FIG. 3 is a diagram showing the hierarchical arrangement of the modules of this assembly.

The circuit itself is a module, and consists of simpler modules, some of which may themselves consist of even simpler modules. At the lowest level, there are elementary modules which do not consist of simpler modules. The circuit description is in terms of module types and named modules; each module type has its function defined, each named module has its inputs and outputs defined and its construction defined (if it is composed of simpler modules) or its type defined (if it is an elementary module), and the connections between the modules are defined. FIG. 3 is a diagram illustrating generally the hierarchy of the modules of the circuit above. (The module bus'(data) should be disregarded for the moment.)

The edge generator module itself is defined by a series of statements. The first is self-explanatory, naming the module itself;
module (egen)
Next, the ports are defined:
port (egen,eram,input,array[1 . . . 2**N] of integer(M))
port (egen,select,input,bit)
port (egen,addr,input,integer)
port (egen,edgeout,output,integer)
The last three of these statements are largely self-explanatory; they are ports of the module egen, the second variable in each statement is the name of the signal at the port, they are inputs or outputs as the case may be, and the signals on them are bits or integers as the case may be. The last variable in the first statement is a formal way of indicating that the input signal is a list or array of $2^N$ elements, each of which is an integer.

Next, the components or parts of the module are defined. The present module has six parts, the two counters, the OR gate, the address and data buses, and the RAM. Typical part statements are:
part (egen,odd_counter,counter)
part (egen,even_counter,counter)
part (egen,data_bus, bus(M))
part (egen,tsram,ram(M,N))

These statements are largely self-explanatory. The third variable defines the type of the part: a counter, an M-bit bus, or an M×N RAM. It will be noted that the module is defined as having two counters, even_counter and odd_counter, which are of the same type; the third variable in the two statements is the same in both. Thus in practice, a library of part types would normally exist and gradually be expanded, and the formal specification of particular modules would gradually become largely a matter of picking out the parts types and specifying the modules as combinations of known part types together with their interconnections.

Next, the connections between the various devices of the module are defined. The statements for this are largely self-explanatory; typical ones are:
connected (egen,select,enable(odd_counter))
connected (egen,out(odd_counter),in1 (edgeor1))

This completes the description of the assembly as such, i.e. the module egen. However, the component parts must be defined. If a component part is itself defined in terms of further modules, it is described in just the same way as the whole assembly. If however it is an elementary module, its definition has port statements but no part or interconnection statements; instead, it has an output equation statement. For example, a bus is defined by the statements:

```
module(bus(m))
port(bus(M),in,input,integer(M))
port(bus(M),out,output,integer(M))
OutputEqn(bus,out) = in.
```

An OR gate is defined by:

```
module(edgeor)
port(edgeor,in1,input,integer)
port(edgeor,in2,input,integer)
port(edgeor,out,output,integer)
OutputEqn(edgeor,out) = if (in1 = 0) then in2
else if (in2 = 0) then in1.
```

For features of the module which involve timing considerations—i.e. those which are not simply pure combinatorial logic circuits—the timing aspects have to be taken into account. This may permit a choice as to the level of detail involved. In the present module, for example, there are the "cycles" determined by the loop pulse generator pgen, and the "clock ticks" of the clock feeding the counters in the pulse generators; different cycles are different and (generally) fairly large numbers of clock ticks long. It is desirable to choose the level of detail, i.e. the size of the "elementary period" used for the formal description, appropriately. If it is chosen too large, it may not be possible to obtain a test program of signal; if it is chosen too small, the task of determining a test program may be unduly complicated.

With the present module, although there are events occurring inside a cycle, such as counters reaching their present counts, it is clear in this instance that the behaviour of the components involved in such events can be adequately specified by specifying their states at the end of each cycle. Also, the microprocessor only observes the state of the system at the end of each cycle—it cannot observe events occurring inside a cycle. It is therefore appropriate to choose the "cycle" as the elementary period.

For the flip-flop peff, therefore, the output equation is supplemented by internal state statements together with state equations which specify the state of the flip-flop at the end of each cycle in terms of events which have occurred during the current cycle and its state at the end of the previous cycle. The states and equations are:

```
OutputEqn(peff,out) = edgeseen
state(peff,pendingedge,bit,false)
state(peff,edgeseen,bit,false)
StateEqn(peff,pendingedge) =
    if edge > period then 1
    else pendingedge.old
StateEqn(peff,edgeseen) =
    if pendingedge then 1
    else if period > edge > 0 then 1
    else edgeseen.old.
```

It is thus evident that any assembly can be formally defined by means of Prolog-like statements. The assembly itself, and any component module which is not elementary, is defined in terms of its inputs, outputs, component modules, and interconnections, and each elementary module is defined in terms of its inputs, outputs, interconnections, output equations, and—if necessary—its state equations.

Defining the Fault

As noted above, it is necessary to define in advance the nature of the fault which is to be detected. For present purposes, it will be assumed that the fault to be detected is a stuck-at-1 fault on one of the bus lines. The desired behaviour of a bus bus is:

```
bus(Name,Value) = =
    Value,
``` while the behaviour of a bus bus' with this fault is:

```
bus'(Name,Value) = =
    if(Name = data & bit(Value,n) = 0) then Value + 2**n
    else Value.
```

The convention is used that the faulty version of a device is distinguished by a prime. Returning to FIG. 3, this also shows the hierachy for the faulty module, which includes the module bus'(data) (connected by broken lines) in place of the sound module bus(data).

It will be noted that this fault is defined parametrically. In other words, this description of the fault defines 16 separate possible faults, corresponding to the 16 possible stuck-at-1 conditions on the 16 lines of the bus. It is highly advantageous to describe faults in this way, since it permits a single programme of test inputs to be determined for the whole bundle of faults, or at least a set of programmes having a common parametric definition.

APPARATUS FOR GENERATING TEST CONDITIONS

Given a formal description of the assembly and of the fault to be tested for, a program—a test combination or sequence of combinations—of inputs has to be determined, from these descriptions, which will detect the fault—i.e. will give different combinations of outputs depending on whether or not the fault is present. To be precise, there are two versions of the assembly—the sound one and the faulty one—and a test programme has to be discovered which will give different output combinations when applied to the two versions of the assembly. This is achieved by starting with the two sets of statements defining the two versions of the assembly, applying a series of unfolding and simplification steps to them, and extracting discrimination or distinguishability conditions (DCs). From these, a test program can be obtained.

In this process, the two versions of the assembly are treated in the same way, to preserve and exploit the isomorphism between their structures. Further, for the initial stages of the process, the two versions of the assembly appear identical, so it is not until the difference between the two versions becomes explicit that the two versions need to be treated differently.

Figure 4:
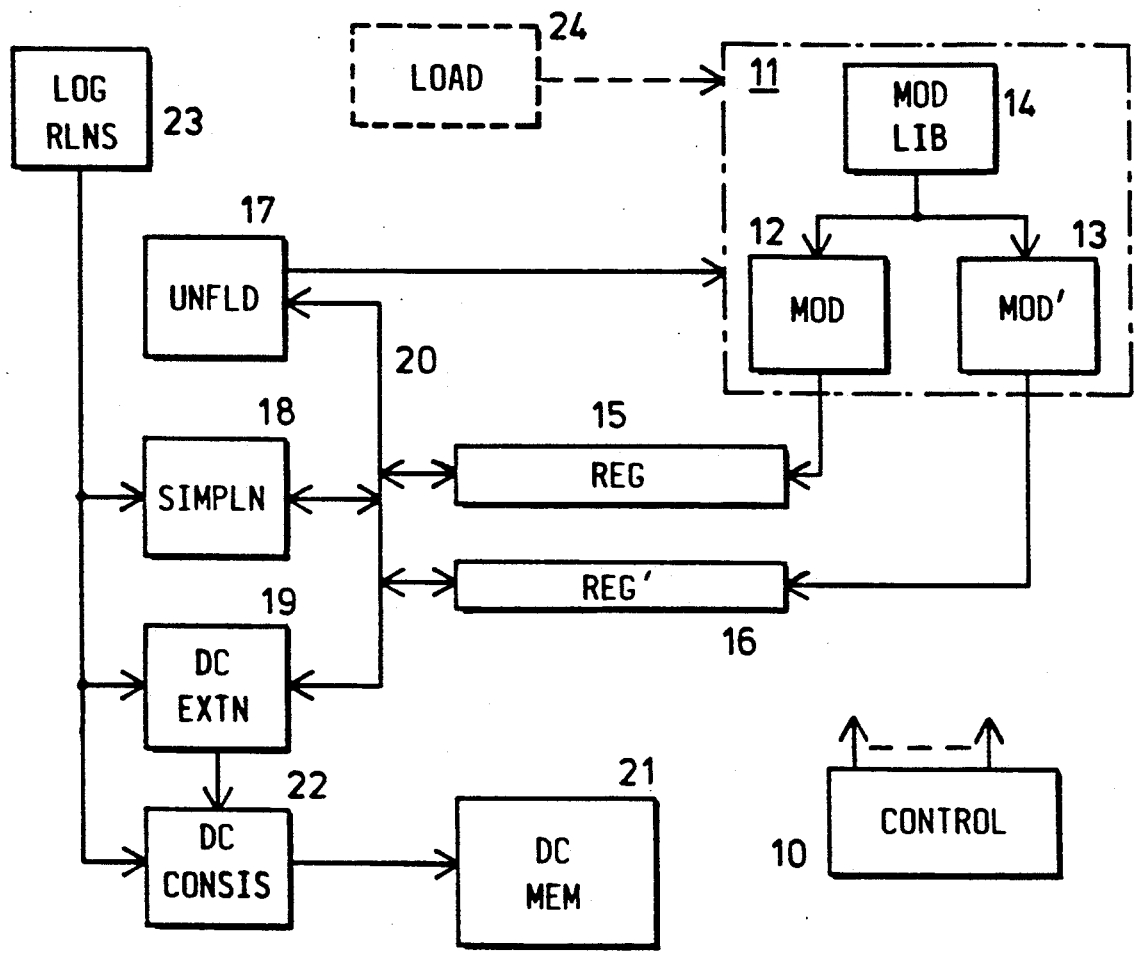
FIG. 4 is a block diagram of apparatus for carrying out the invention.

FIG. 4 is a simplified block diagram of apparatus for carrying out this process. A control unit 10 controls the sequence of operation of the rest of the units of the apparatus.

A memory unit 11 includes two memories 12 and 13, containing the formal hierarchical descriptions of the sound assembly and the faulty assembly respectively. These memories are both coupled to a memory 14 which contains a library of formal descriptions of standard modules—i.e. of modules which are likely to form parts of the assembly for which a set of test conditions is to be determined. Hence modules which are the same in both assemblies may be identified in the descriptions in the memories 12 and 13, but the details of the descriptions may be stored in the memory 14. These details will be accessed by the memories 12 and 13 when required. Also, if there are two or more identical modules in a assembly, the description of the assembly will identify those modules, while the details of the descriptions may be stored in the memory 14 and accessed by the memory 12 or 13 each time they are required for any of the identical modules. (Oviously modules can similarly be composed of sub-modules.)

It will be realized that in principle, it would be possible for each of the memories 12 and 13 to contain a complete description of its assembly. However, this would involve considerable duplication of information.

In a converse manner, while one of the memories 12 and 13 must contain a complete description of its assembly (say the sound assembly), the other need only contain a description of the difference between the two assemblies; that is, that part of its assembly containing the fault in a form in which the corresponding sound part in the memory 12 can be identified. The description of the remainder of the faulty assembly can then be copied from the memory 12 when required.

There are two representation registers, 15 and 16, for holding formal representations of the sound assembly and the faulty assembly respectively. These formal representations are obtained initially from the two memories 12 and 13, and are subjected to various manipulations. These two registers are coupled via a bus 20 to three processing units: an unfolding processor 17, a simplification processor 18, and a discrimination (or distinguishability) condition (DC) extraction processor 19. (These processors, and other units of the system, can of course be modules of a suitable program or, in the case of storage units, memory areas defined by such a program.) These processors operate broadly in sequence.

Each of these processors can carry out certain manipulations on the expressions in the registers 15 and 16. The unfolding processor 17 can make calls to the memory unit 11 to control the initial loading of these registers, and in order to unfold the expressions in these registers. Also, when the DC extraction processor 19 detects DC's, it can delete them from the expressions in these registers. When the expressions in the registers 15 and 16 have been reduced to nothing, the list of DC's in the memory 21 together form the required set of test conditions which will allow the faulty assembly to be distinguished from the sound one.

When the DC extractor processor 19 detects a DC, it in fact passes it to a DC consistency checking processor 22, which compares the DC from processor 19 with the DC's already stored in the DC memory 21 to determine whether the new DC is logically consistent with the stored DC's. If it is logically consistent, then it is stored into the DC memory 21. However, if it is logically inconsistent, it is rejected as a DC and left in the expressions in the registers 15 and 16, and the system continues by looking for further DC's and simplifications. The logical rules used by the processors 18, 19, and 22 are stored in a logical rules memory 23, which is coupled to all these processors. (In fact, the processors 18 and 22 in particular use the same rules to an appreciable extent.) When the DC has been accepted or rejected by the processor 22, control passes back to processor 17 for the next stage of unfolding.

It may be desirable for the simplification and DC extraction steps to be intermingled, so that the expressions in the registers 15 and 16 are examined for possible DC's after each individual simplification (i.e. each application of any of the simplification rules). If any DC's are found and extracted, further simplification will be attempted. Only after all DC's have been extracted and no further application of the simplification rules is possible will control return to processor 17 for the next stage of unfolding.

It will be realized that it is possible to allow interaction with an operator, by displaying the contents of the two registers 15 and 16 and allowing the operator to guide the operation of the processors 17 to 19. This option is particularly useful with regard to the operation of the simplification processor 18, for various reasons.

One is that operations of the general class with which the present invention is concerned are liable to suffer from what is termed exponential explosion; that is, the number of possible courses grows exponentially and is liable to become unmanageable. In the present invention, the greatest danger of exponential growth is in the simplification stage, and operator guidance may help to limit such growth.

The second reason is concerned with the nature of simplification. As will be seen, simplification can involve logical manipulation, arithmetical manipulation, and use of special properties of the assembly (such as, for example, that two different sub-modules cannot be active simultaneously). It is fairly straightforward to build the rules for logical manipulation into the processor 18. However, the rules for arithmetical manipulation are harder to build in effectively, because arithmetic is a more complicated formal system than logic. (Indeed, a sufficiently simple formal logical system has full provability, while arithmetic cannot, because of Gödel's theorem.) Hence it may be feasible for an operator to recognize arithmetical equivalences which cannot easily be built into the processor 18. (For example, it would be difficult to build arithmetic rules into the system which were capable of dealing with polynomial or cyclic redundancy check functions.) Similarly, it may be easier for an operator to recognize special properties of the assembly than for these to be predefined in an extended formal system description or for the system itself to discover them as consequences of the formal system description.

Simplification, as will be seen later, consists essentially of manipulating logical expressions. This can be done from the inside outwards, starting inside the innermost brackets of an expression and carrying out any possible manipulations at that level first, and then gradually working up through the brackets to the outermost expressions; from the outside inwards, starting with unbracketed expressions, and gradually working down into any hierarchy of brackets; or by a combination of both techniques.

OPERATION OF THE SYSTEM

The manner in which the system operates to obtain discrimination conditions for the circuit of FIGS. 1 to 3 is as follows.

Unfolding

Unfolding is carried out by the unfolding processor 17, operating on the formal descriptions held in the registers 15 and 16. For this, processor 17 selects an element in the contents of the formal descriptions, and causes it to be replaced by the definition of that element in terms of simpler elements. The processor preferably operates broadly in a top down manner, unfolding different branches more or less in step with each other. Thus in unfolding the tree shown in FIG. 3, if even_counter is selected for unfolding after edgeor has been unfolded, the system will next select odd_counter for unfolding, rather than trying to unfold data_bus. (In fact, it is evident that data_bus cannot be unfolded until both the counters have been unfolded.) Also, processor 17 unfolds the two expressions (for the sound assembly and the faulty assembly respectively) in step with each other as far as possible.

The edge generator is defined as

```
egen(Name,Eram,Select,Addr) = =
    edgeor(edgeor1,
        counter(even_counter,
            Select,
            bus(data_bus,ram(tsram,Eram,
                bus(address_bus,Addr)))),
        counter(odd_counter,
            Select,
            bus(data_bus,ram(tsram,Eram,
                bus(address_bus,Addr)))).
```

To initiate unfolding, the call to edgeor is opened, this function being defined as

```
edgeor(Name,E1,E2) = =
    if (E1 = 0) then E2
        else (if (E2 = 0) then E1),
``` where
E1=counter(even_counter,Select,bus(_))
E2=counter(odd_counter,Select,bus(_)).
(The bus definition is abbreviated to . . . for convenience.) The unfolding processor 17 deletes the term edgeor from the register 13, and causes it to be replaced by the expression just given. Thus the unfolding which results from this call is:

```
egen(Name,Eram,Select,Addr) = =
    if (counter(even_counter,Select,bus(. . .) = 0) ) then
        counter(odd_counter,Select,bus(. . .))
    else if (counter(odd_counter,Select,bus(. . .) = 0) then
        counter(even_counter,Select,bus(. . .)).
```

The call to counter is now unfolded in this last expression, in the same way. The function counter is defined as

```
counter(Name,Select,Arg) = =
    if ((Name = Select) & (Arg =/= e_off_c)) then Arg else 0.
```

This unfolding yields

```
egen(Name,Eram,Select,Addr) = =
    if( (if (even_counter = Select) & bus(. . .) =/= e_off_c
        then bus(. . .)
        else 0) = 0)
    then
        (if (odd_counter = Select) & bus(. . .) =/= e_off_c))
        then bus(. . .)
        else 0)
    else
        if ((if (odd_counter = Select) & bus(. . .) =/= e_off_c
            then bus(. . .)
            else 0) = 0)
        then
            (if ((even_counter = Select) & bus(. . .) =/= e_off_c))
            then bus(. . .)
            else 0).
```

Simplification

After each unfolding, the simplification processor 18 attempts to perform simplifications, and the discrimination condition extraction processor 19 attempts to extract discrimination conditions. In this particular example, no simplification or extraction of discrimination conditions has been possible until now. At this point, however, several stages of simplification are possible. These are performed by the simplification processor 18, which contains a set of rules, together with means for recognizing the occurrence of their left-hand sides in the expressions in the registers 15 and 16 and for applying the simplifications by replacing the relevant elements of those expressions by their right-hand side equivalents. The rules consist of standard logic simplification rules, standard arithmetical simplification rules, and rules expressing some property of the assembly.

There are several logic simplification rules which can be applied to the above expression, as follows:
(if c then x else y)=q→if c then (x=q) else (y=q).
if (if c then x else y) then a else b)→if (c & x) or (not(c) & Y) then a else b.
x=x→true.
x & true→x.
not(a & b)→not(a) or not(b).
if (c1 or c2) then x1 else (if (c2 or c4) then x3 else x4)→if (c1 or c2) then x1 else (if (false or c4) then x3 else x4).
if (c1 and c2) then x1 else (if (c2 or c4) then x3 else x4)→if (c1 and c2) then x1 else (if (true or c4) then x3 else x4).
if true then x else y→x.
if false then x else y→y.
if c then x else x→x.
p or (not(p) & q)→p or q.

if c1 then (if c2 then x1 else x2) else x3)→if (c1 and c2) then x1 else (if not c1 then x3 else x2).

if c1 then x else (if c2 then x 4 else y)→if (c1 or c2) then x else y.

if p=q then p else q→q.

With regard to rules expressing some property of the assembly, it is a property of the assembly in the present example that not  (Select=even_counter)↔(Select=odd_counter).

Applying all these rules, in the appropriate order, to the expression for egen, this expression simplifies to

```
egen(Eram,Select,Addr) ==
    if (bus(data,tsram(Eram,bus(addr,Addr))) =/= e_off_c)
    then bus(data,tsram(Eram,bus(addr,Addr))))
    else 0.
```

Unfolding

So far, there has been no significant distinction between the two versions of the assembly, so the expression for egen' is the same except that bus' appears in place of bus. The discrimination condition extraction processor 19 is therefore unable to extract any discrimination conditions yet. A further unfolding step therefore follows now, to call bus and bus' in the expressions for the two versions of the device. As noted above, these two functions are defined as

```
bus(Name,In) == In
bus'(Name,In) == if (Name = data) & (bit(In,n) = 0) then
In + 2**n else In.
```

The unfolding of the calls to bus in egen yields

```
egen(Eram,Select,Addr) ==
    if (nthof(Eram,Addr) =/= e_of_c)
    then nthof(Eram,Addr) else 0.
``` for the sound version, and

```
egen'(Eram,Select,Addr) ==
    if (nthof(Eram,Addr) =/= e_of _c)
    then      if (bit(nthof(Eram,Addr),n = 0)
               then nthof(Eram,Addr) + 2**n
               else nthof(Eram,Addr))
    else 0.
```

Extraction of DC's

Following the above exercise of the unfolding and simplification rules, some distinguishability conditions can now be identified. This is done by the discrimination conditions extraction processor 19. Various discrimination rules are stored in this processor, which uses them to systematically discriminate between two functions in suitable matching form.

We shall use the notation F1=?=F2 to indicate that two functions F1 and F2 are distinguishable. Two discrimination rules which apply to two conditional functions are:

if (F1==(if C then X else Y)) and (F2==(if C then X' else Y) then (F1=?=F2 iff (C and X=?=X')).

X=?=(if C then X' else X) iff (C and X=?=X').

By taking

C as (nthof(Eram),Addr)=/=e_of_c)),

X as (nthof(Eram,Addr), and

X' as (if (bit ( ... ) then nthof ( ... ) else nthof ( ... ))), we can apply the first discrimination rule to the expressions for egen and egen', obtaining

```
egen =?= egen'
iff
    (nthof(Eram,Addr) ) =/= e_of_c)
    and
    (nthof(Eram,Addr) =/= if (bit(nthof(Eram,Addr),n) = 0) then
         nthof(Eram,Addr) + 2**n
         else nthof(Eram,Addr).
```

Thus we have obtained one DC, nthof(Eram,Addr)=-/=e_of_c, and a new discrimination goal. Applying the second discrimination rule then yields

```
bit(nthof(Eram,Addr),n) = 0
and nthof(Eram,Addr) =?= nthof(Eram,Addr) + 2**n.
```

Thus a second discrimination condition, bit(nthof-(Eram,Addr),n)=0, is obtained.

By continuing the processes of unfolding, simplification, and extraction of discrimination conditions, a sequence of discrimination conditions are obtained which together will enable a test programme for the circuit to be devised.

The simplest way of controlling the sequence of operation of the processors 17, 18, 19, and 22 is for them to operate in strict sequence. However, this strategy is inflexible, although it may have some advantage in efficiency. The control unit 10 therefore preferably controls this sequencing of the processors 17, 18, 19, and 22, by means of rules built into it which determine the conditions under which each gets control. This arrangement facilitates the writing of specific strategies for dealing with circuits that follow a specific design technique (e.g. partial scan or boundary scan) and for which a corresponding specific testing method is particularly suitable.

Test Condition for Circuit Described

In the case of the circuit being considered (i.e. the circuit of FIGS. 1 and 2), it is evident that in order to test for a stuck-at-1 fault on one of the lines of the data bus, a test situation must be devised in which that fault makes a difference to the behaviour of the circuit. The only feature of the module which is observable from outside is the state of the pulse edge flip-flop peff at the end of the cycle determined by the loop pulse generator pgen. So the test situation must be such that for the sound system, the state of this flip-flop is different at this time from its state for the faulty system. The signal setting this flip-flop comes from the edge generator egen, and to achieve discrimination, its timing must be shifted between before and after the pulse from the loop pulse generator by the error. This timing is determined by the signal on the data bus and the error (if any) on this bus. Hence to detect the error, the stored delay in the test RAM must be such that the change from a 0 bit on the faulty line to 1 (the fault being stuck-at-1) must shift the delay from below that of the delay of the loop pulse generator to above it.

The present system successfully achieves this; i.e., it successfully generates a set of discrimination conditions which embody this requirement.

Bottom-Up Circuit Expansion

The process described above may be termed a top-down approach to circuit development (i.e. to the expansion of the formal descriptions of the sound and faulty modules.) This can be described informally as starting with a top-level definition of the systems with and without the fault in the registers 15 and 16 and unfolding these definitions so as to ascertain how to discriminate at a high level before moving down. An alternative approach, which may be termed a bottom-up approach, may instead be employed. This involves starting with definitions of a specific module with and without the fault (i.e. a low level definition) in the registers 15 and 16 and unfolding these to ascertain how to discriminate at a low level. The process then involves moving up to expressions describing a larger part of the whole system including the initially chosen module and unfolding that expression.

The bottom-up approach makes it easier to utilize a flexible and opportunistic control strategy which can focus on that part of the search tree which has a higher likelihood of finding a consistent set of discrimination conditions, thereby reducing the likelihood of getting into dead ends. The provision of explicit control also provides a way to enter any testability strategy that the circuit designer might have had in mind (whether they were following a formal or informal design for a test method).

In the case of simple top-down strategy, the loading of the registers 15 and 16 is trivial. The top-level definitions of the sound and faulty assemblies are copied into the registers 15 and 16 before the unfolding, simplification, and discrimination loop is entered. The unfolding processor 17 has been described as controlling this. However, for the bottom-up approach, with its more general inference control strategy, it is desirable to provide an additional processor, load processor 24. Its task is broadly to select the level at which discrimination is performed. This processor loads the working registers 15 and 16 using the information from the storage unit 10; in effect it decides at each stage how to move up the trees (examples of which are shown in FIG. 3) representing the circuits being tested. (Obviously the control line from the unfolding processor 17 to the storage unit 10 would be removed.)

RECURSIVE DEVICES

Figure 5:
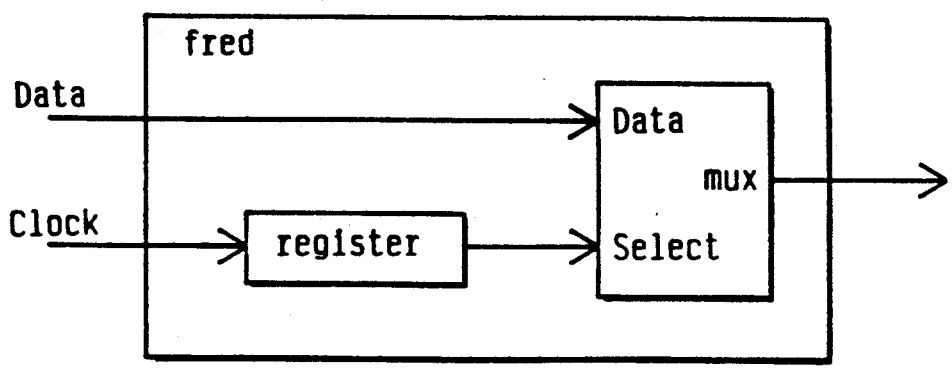
FIG. 5 is a block diagram of a recursive module.

In the circuit of FIGS. 1 and 2, the length of the test programme (i.e. the number of successive combinations of test signals required) is independent of the fault parameter. However, this is not always the case, and a simple example is the circuit shown in FIG. 5, which is termed fred (first recursive electronic device). This circuit consists of a multiplexer mux and a counter register register, the circuit selecting each line in turn of the input data bus Data. To test for a stuck-at-0 fault on the n-th line of the data bus, a test sequence of at least n bits is needed. It turns out that for such a fault, the discrimination conditions can best be expressed by a recursive equation Discrimination Conditions = = bit(Data, n)=0 and P(n, Clock, 0) where the predicate P is defined recursively as $$P(n, \text{Clock}, \text{Register}) == (n = \text{Register and not}(\text{Clock} = 0))$$
or
$$P(n, \text{rest}(\text{Clock}), s(\text{Register})).$$

For given n and data, the desired test conditions are in Clock and Register of these equations. The quantity Register is straightforward; it is the count in the register. The quantity Clock is the one which is essentially a time sequence of signals; it can be regarded as a list [$S_1$, $S_2$, $S_3$, ... ], in which the terms are the successive values of the signal bit; rest(Clock) is the tail of this list (i.e. the list with its leading term deleted). Thus the recursive form of predicate P in effect determines the effect of the bits of the bit stream Clock bit by bit. (It will be realized that the term Clock must be taken as representing an arbitrary stream of 0's and 1's, not a steady stream of 1's.)

Representing recursive modules in this manner allows the system to cope with such modules as well as with non-recursive ones.

Although a particular embodiment of the invention has been shown and described, other embodiments and modifications will occur to those of ordinary skill in the art which fall within the scope of the appended claims.

We claim:

1. Apparatus for assisting in the generation of a test program for testing a digital circuit assembly for a predetermined fault comprising:
   means for storing formal hierarchical descriptions sufficient to define the assembly without and with the fault;
   register means for holding for the assembly without the fault and the assembly with the fault a representation of at least a part of the assembly derived from its formal description as content;
   unfolding processor means for hierarchically expanding the contents of the register means;
   simplification processor means for applying simplification rules to the contents of the register means; and
   discrimination condition extraction processor means for extracting discrimination conditions from the contents of the register means.

2. The apparatus according to claim 1 wherein said means for storing the formal hierarchical descriptions comprise primary storage means for storing the formal hierarchical descriptions relating to the assembly without the fault and the assembly with the fault, and a submodule storage means coupled thereto for storing descriptions of submodules which may be repeated in the assemblies and/or common to both.

3. The apparatus according to claim 2 wherein said primary storage means comprise first storage means for storing a complete description of one of the assemblies, and second storage means for storing a description of a manner in which the assembly with the fault differs from the assembly without the fault.

4. The apparatus according to claim 1 wherein the discrimination condition extraction processor is coupled to a discrimination condition storage means for accumulating successive discrimination conditions determined by that processor.

5. The apparatus according to claim 4 wherein the discrimination condition extraction processor and the discrimination condition storage means have coupled to them discrimination condition consistency checking means for checking the consistency of successive discrimination conditions determined by the discrimination condition extraction processor against the accumulating successive discrimination conditions stored by the discrimination condition extraction storage means.

6. The apparatus according to any previous claim further comprising logical relations storage means couple to and storing rules used in common by a plurality of said processor means and the discrimination condition consistency checking means.

7. The apparatus according to claim 6 wherein the rules stored by said logical relations storage means comprise logical rules, arithmetical rules, and rules relating to specific circuit properties of each assembly without and with the fault.

8. The apparatus according to any previous claim 1 through 5 wherein said simplification processor allows an operator to intervene to perform certain simplifications.

9. The apparatus according to any previous claim 1 through 5 further comprising loading processor means for loading into said register means a plurality of items of said formal descriptions in sequence with an operator of each said processor means on the contents of the register means.

10. The apparatus according to any previous claim 1 through 5 further comprising control means for controlling a sequence of operation of each said processor means.

11. A method of assisting in generation of a test program for testing a digital circuit assembly for a predetermined fault comprising:
storing formal hierarchical descriptions sufficient to define the assembly without and with the fault;
storing for the assembly without the fault and for the assembly with the fault a representation of at least a part of the assembly derived from its formal description;
hierarchically expanding the stored representation;
simplifying the stored representation; and
extracting discrimination conditions from the stored representations.

12. The method of claim 11 wherein the step of storing the formal hierarchical description comprises:
storing the formal hierarchical description relating to the assembly without the fault and the assembly with the fault; and
storing the respective description of submodules of the assembly without the fault and the assembly with the fault.

13. The method of claim 11 further comprising the step of storing accumulated successive discrimination conditions.

14. The method of claim 12 comprising the step of checking consistency of successive discrimination conditions against the stored accumulated discrimination conditions.

* * * * *

UNITED STATES PATENT AND TRADEMARK OFFICE
CERTIFICATE OF CORRECTION

PATENT NO. :   5,084,876
DATED      :   January 28, 1992
INVENTOR(S):   Robert K. Welham and Ajay Gupta It is certified that error appears in the above-identified patent and that said Letters Patent is hereby corrected as shown below:

Column 2, line 62, change "Introductory Summary" to

--Description of the Preferred Embodiment--.

Column 7, line 55, change "signal" to --signals--.

Column 13, line 47, after "n" (second occurrence), insert

--)--.

Column 13, line 57, change "conditions" to --condition--.

Column 17, lines 5-6, change "couple" to --coupled--.

Column 18, line 16, change "description" to --descriptions--.

Signed and Sealed this

Seventeenth Day of August, 1993

Attest:

BRUCE LEHMAN

Attesting Officer

Commissioner of Patents and Trademarks